United States Patent
Qi et al.

(10) Patent No.: US 9,058,893 B2
(45) Date of Patent: Jun. 16, 2015

(54) SHIFT REGISTER AND THE DRIVING METHOD THEREOF, GATE DRIVING APPARATUS AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Xiaojing Qi, Beijing (CN); Bo Wu, Beijing (CN); Wen Tan, Beijing (CN); Young Yik Ko, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 0 days.

(21) Appl. No.: 13/805,710

(22) PCT Filed: Nov. 20, 2012

(86) PCT No.: PCT/CN2012/084920
§ 371 (c)(1),
(2) Date: Dec. 20, 2012

(87) PCT Pub. No.: WO2013/078955
PCT Pub. Date: Jun. 6, 2013

(65) Prior Publication Data
US 2014/0177780 A1  Jun. 26, 2014

(51) Int. Cl.
*G11C 19/28* (2006.01)
*G09G 3/20* (2006.01)
*G09G 3/36* (2006.01)

(52) U.S. Cl.
CPC *G11C 19/28* (2013.01); *G09G 3/20* (2013.01); *G09G 2310/0267* (2013.01); *G09G 2310/0286* (2013.01); *G09G 3/3674* (2013.01); *G09G 2310/062* (2013.01)

(58) Field of Classification Search
USPC .................. 327/64, 78, 79; 345/100
See application file for complete search history.

(56) References Cited

U.S. PATENT DOCUMENTS 8,614,661 B2 * 12/2013 Tan et al. ............. 345/100
8,737,560 B2 *  5/2014 Tan et al. ............. 377/64
(Continued)

FOREIGN PATENT DOCUMENTS

| CN | 101645308 A | 2/2010 |
| CN | 101779252 A | 7/2010 |

(Continued)

OTHER PUBLICATIONS

International Preliminary Report on Patentability dated Jun. 3, 2014; PCT/CN2012/084920.

(Continued)

*Primary Examiner* — Patrick O'Neill
(74) *Attorney, Agent, or Firm* — Ladas & Parry LLP (57) ABSTRACT

The present invention provides a shift register, a driving method, a gate driving apparatus and a display apparatus. Said shift register comprises a pull-up unit, a reset unit, a pull-down unit and a signal output; the pull-up unit is connected to said signal output and pulls up an output signal; the reset unit is connected to a control end of said pull-up unit and said signal output respectively and resets the potential of the control end of said pull-up unit after said output signal is at high level; the pull-down unit is connected to a control end of said pull-up unit and said signal output respectively and pulls down the potential of the control end of said pull-up unit and said output signal after said reset unit has reset the potential of the control end of said pull-up unit, so that said pull-up unit switches off.

8 Claims, 7 Drawing Sheets

(56) References Cited

U.S. PATENT DOCUMENTS

2010/0141642 A1    6/2010  Furuta et al.
2011/0150169 A1*   6/2011  Lin et al. .................. 377/64
2014/0177780 A1    6/2014  Qi et al.

FOREIGN PATENT DOCUMENTS

CN    102708778 A    10/2012
TW    201123728 A     7/2011

OTHER PUBLICATIONS

International Search Report Appln. No. PCT/CN2012/084920; Issued Feb. 28, 2013.

First Chinese Office Action Appln. No. 201110385760.5; Issued Mar. 28, 2013.

* cited by examiner (PRIOR ART)
Figure 1

SHIFT REGISTER AND THE DRIVING METHOD THEREOF, GATE DRIVING APPARATUS AND DISPLAY APPARATUS

FIELD OF INVENTION

The present invention relates to the field of circuit driving technology, particularly to a shift register adopting GOA (Gate Driver on Array) technology and driving method thereof, a gate driving apparatus and a display apparatus.

BACKGROUND

In TFT-LCD (Thin Film Transistor-Liquid Crystal Display), the basic principle of displaying a frame of image is to output the signals required by every row/line of pixels from top to bottom in turn via source driving, and input square waves of certain width to every pixel row/line from top to bottom in turn for enabling via gate driving.

Figure 1:
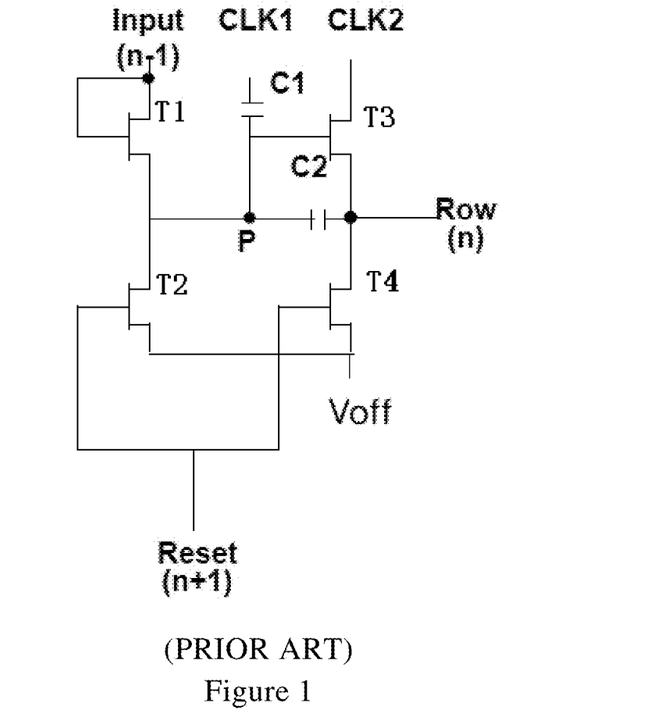
FIG. 1 is a circuit diagram of an existing shift register that is applied to a liquid crystal display gate driving apparatus.

As shown in FIG. 1, an existing shift register applied to a liquid crystal display gate driving apparatus comprises a pre-charge unit T1, a pull-up unit T3, a reset unit T2 and a pull-down unit T4. Node P (the node that is connected to the source of T1) is connected to a clock signal CLK1 via a capacitor C1, the drain of T3 is connected to a clock signal CLK2, node P is connected to the source of T3 via a capacitor C2, and Voff may be either zero or low potential (e.g. GND or VSS power supply). When the output signal Input(n−1) of a pre-stage shift register is at high level, T1 pre-charges node P (the node connected to the source of T1); T3 collaborates with the timing of CLK2 so that the output signal Row(n) of the current stage shift register is at high level; when the output signal Reset(n+1) of the next-stage shift register is at high level, T2 resets the control end of T3, T4 resets the output signal Row(n) of the current stage shift register. When the output signal Reset(n+1) of the next-stage shift register is at low level, the control end and output of T3 are floating, which results in the instability of the output signal Row(n) of the current stage shift register.

Furthermore, the current manufacturing method uses the COG (Chip On Glass) technique to adhere gate driving IC and source driving IC onto a glass panel. In the case of small-sized TFT-LCD, when the resolution is relatively high, the gate driving and source driving may output more, and the length of driving IC may increase, which would be disadvantageous to the bonding technique of module driving IC.

SUMMARY

The main purpose of the present invention is to provide a shift register and driving method thereof, a gate driving apparatus and display apparatus, which improves the problem of shifting of pull-down TFT (Thin Film Transistor) threshold under a DC bias, and the problem of output in the shift register circuit being floating, and thus improving the reliability of the circuit.

To achieve the above purpose, the present invention provides a shift register, comprising a pull-up unit, a reset unit and a signal output, wherein, said pull-up unit is connected to said signal output and is configured to pull up an output signal, so that the output signal is at high level;

said reset unit is connected to a control end of said pull-up unit and said signal output respectively and is configured to reset the potential of the control end of said pull-up unit after said output signal is at high level, so that said output signal is at low level;

characterized in the shift register further comprises a pull-down unit;

said pull-down unit is connected to a control end of said pull-up unit and said signal output respectively, and is configured to pull down the potential of the control end of said pull-up unit and said output signal after said reset unit has reset the potential of the control end of said pull-up unit, so that said pull-up unit switches off to control said output signal to maintain a low level.

In practice, the shift register according to the present invention further comprises a pre-charge unit, said pull-up unit comprises a first TFT and a pull-up capacitor, said pull-up capacitor is in parallel connection between the gate and source of said first TFT;

said first TFT is configured so that the drain is connected to a first clock signal input, the source is connected to a signal output, and the gate is connected to a start signal input via said pre-charge unit; and said pre-charge unit pre-charges said pull-up capacitor under the control of the first clock signal and the start signal before said pull-up unit pulls up the output signal, so that said first TFT turns on.

In practice, said pre-charge unit comprises a second TFT;

said second TFT is configured so that its gate and drain are connected to the start signal input, and its source is connected to the gate of said first TFT;

said reset unit comprises a third TFT and a fourth TFT;

said third TFT is configured so that the gate is connected to the reset signal input, the drain is connected to the signal output and the source is connected to a low level output;

said fourth TFT is configured so that the gate is connected to the reset signal input and the gate of said third TFT respectively, the drain is connected to the gate of said first TFT, and the source is connected to the source of the third TFT and a low level output respectively.

In practice, said pull-down unit comprises a dual-pull-down module and a dual-pull-down control module, wherein, said dual-pull-down module is connected to said dual-pull-down control module, said signal output and the control end of said pull-up unit respectively, and is configured to alternately pull down the potential of said output signal and the control end of said pull-up unit under the control of said dual-pull-down control module.

In practice, said dual-pull-down module comprises a fifth TFT, a sixth TFT and a seventh TFT;

said dual-pull-down control module is connected to a first clock signal input and a second clock signal input;

said dual-pull-down control module comprises an eighth TFT, a ninth TFT, a tenth TFT and an eleventh TFT;

said fifth TFT is configured so that the gate is connected to the gate of said sixth TFT, the drain of said ninth TFT and the source of said eleventh TFT respectively, the source is connected to the low level output, and the drain is connected to the gate of said first TFT, the source of said second TFT and the gate of said eighth TFT respectively;

said sixth TFT is configured so that the source is connected to the low level output and the drain is connected to the signal output;

said seventh TFT is configured so that the gate is connected to the second clock signal input, source is connected to the low level output, and the drain is connected to said signal output;

said eighth TFT is configured so that the gate is connected to the gate of said first TFT, the source is connected to the low level output, and the drain is connected to the source of the tenth TFT and the gate of the eleventh TFT respectively;

said ninth TFT is configured so that the gate is connected to the gate of said first TFT, the source is connected to the low level output, and the drain is connected to the source of said eleventh TFT;

said tenth TFT is configured so that the gate and the drain are connected to the first clock signal input, and the source is connected to the gate of the eleventh TFT; and said eleventh TFT is configured so that the drain is connected to the first clock signal input.

In practice, said dual-pull-down module comprises a fifth TFT, a sixth TFT and a seventh TFT;

said dual-pull-down control module is connected to a first clock signal input and a second clock signal input;

said dual-pull-down control module comprises an eighth TFT, a ninth TFT, a tenth TFT and an eleventh TFT;

said fifth TFT is configured so that the gate is connected to the gate of said sixth TFT, the drain of said ninth TFT and the source of said eleventh TFT respectively, the source is connected to a low level output, and the drain is connected to the gate of said first TFT, the source of said second TFT and the gate of said eighth TFT respectively;

said sixth TFT is configured so that the source is connected to the low level output and the drain is connected to the signal output;

said seventh TFT is configured so that the gate is connected to the second clock signal input, the source is connected to the low level output, and the drain is connected to said signal output;

said eighth TFT is configured so that the gate is connected to the gate of said first TFT, the source is connected to the low level output, and the drain is connected to the source of the tenth TFT and the gate of the eleventh TFT respectively;

said ninth TFT is configured so that the gate is connected to said signal output, the source is connected to the low level output, and the drain is connected to the source of said eleventh TFT;

said tenth TFT is configured so that the gate and the drain are connected to the first clock signal input, and the source is connected to the gate of the eleventh TFT; and said eleventh TFT is configured so that the drain is connected to the first clock signal input.

In practice, said dual-pull-down module comprises a fifth TFT, a sixth TFT and a seventh TFT;

said dual-pull-down control module comprises an eighth TFT, a ninth TFT, a tenth TFT and an eleventh TFT;

said fifth TFT is configured so that the gate is connected to the gate of said sixth TFT, the drain of said ninth TFT and the source of said eleventh TFT respectively, the source is connected to the low level output, and the drain is connected to the gate of said first TFT and the source of the second TFT respectively;

said sixth TFT is configured so that the source is connected to the low level output and the drain is connected to the signal output;

said seventh TFT is configured so that the gate is connected to the second clock signal input, the source is connected to the low level output, and the drain is connected to said signal output;

said eighth TFT is configured so that the gate is connected to said signal output, the source is connected to the low level output, and the drain is connected to the source of the tenth TFT and the gate of the eleventh TFT respectively;

said ninth TFT is configured so that the gate is connected to the gate of said first TFT, the source is connected to the low level output, and the drain is connected to the source of said eleventh TFT;

said tenth TFT is configured so that the gate and the drain are connected to the first clock signal input, and the source is connected to the gate of the eleventh TFT; and said eleventh TFT is configured so that the drain is connected to the first clock signal input.

In practice, said dual-pull-down module comprises a fifth TFT, a sixth TFT and a seventh TFT;

said dual-pull-down control module comprises an eighth TFT, a ninth TFT, a tenth TFT and an eleventh TFT;

said fifth TFT is configured so that the gate is connected to the gate of said sixth TFT, the drain of said ninth TFT and the source of said eleventh TFT respectively, the source is connected to the low level output, and the drain is connected to the gate of said first TFT and the source of said second TFT respectively;

said sixth TFT is configured so that the source is connected to the low level output and the drain is connected to the signal output;

said seventh TFT is configured so that the gate is connected to the second clock signal input, the source is connected to the low level output, and the drain is connected to said signal output;

said eighth TFT is configured so that the gate is connected to said signal output, the source is connected to the low level output, and the drain is connected to the source of the tenth TFT and the gate of the eleventh TFT respectively;

said ninth TFT is configured so that the gate is connected to said signal output, the source is connected to the low level output, and the drain is connected to the source of said eleventh TFT;

said tenth TFT is configured so that the gate and the drain are connected to the first clock signal input, and the source is connected to the gate of the eleventh TFT; and said eleventh TFT is configured so that the drain is connected to the first clock signal input.

The present invention further provides a method for driving a shift register, applied to the above shift register, the method for driving a shift register comprises the following steps:

a pulling-up step: a pull-up unit pulling up an output signal of every stage of the shift register, so that the output signal of said stage of the shift register is a high level;

a resetting step: resetting the potential of the control end of said pull-up unit after said output signal is at high level, so that said output signal is at low level; and a pulling-down step: a pull-down unit pulling down the potential of the control end of said pull-up unit and said output signal, so that said pull-up unit switches off and said output signal maintains at low level.

In practice, when said pull-up unit is a pull-up TFT and a pull-up capacitor is in parallel connection between the gate and source of said pull-up TFT, said method for driving a shift register further comprises a pre-charging step prior to said pulling-up step: pre-charging said pull-up capacitor when a first clock signal is at low level and a start signal is at high level, so that said pull-up TFT turns on.

The present invention further provides a gate driving apparatus, which comprises multiple stages of the above shift register on a liquid crystal display array substrate fabricated with array film techniques;

except for the first stage, the signal output of every shift register is connected to the reset signal input of the adjacent previous shift register; and except for the last stage the signal output of every shift register is connected to the start signal input of the adjacent next shift register.

The present invention further provides a display apparatus, which comprises the above liquid crystal display gate driving apparatus.

Compared with the prior art, the shift register, liquid crystal display gate driving apparatus and the method thereof and the display apparatus according to the present invention address the issue of stray effect brought by a clock modulation and improve the problem of shifting of a pull-down TFT threshold shifts under a DC bias by a dual-pull-down design, and meanwhile improve the problem of output being floating in a shift register circuit, and so improve the reliability of the circuit; in the meantime the usage of the power supply and the power consumption are both reduced.

DETAILED DESCRIPTION

Figure 2:
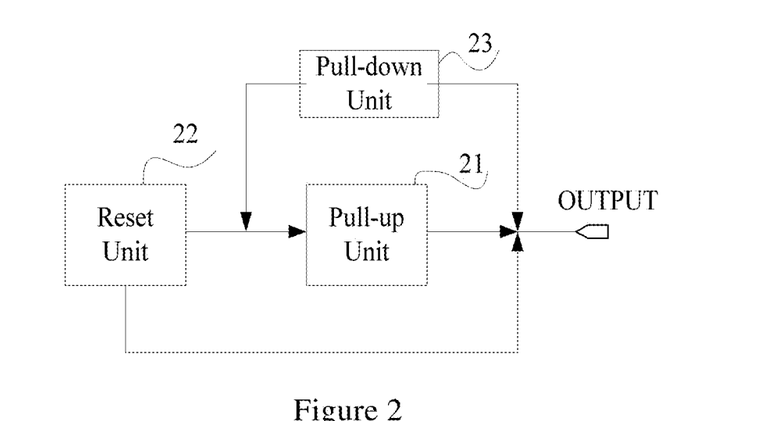
FIG. 2 is circuit diagram of a shift register according to the first embodiment of the present invention.

As shown in FIG. 2, the shift register according to the first embodiment of the present invention comprises a pull-up unit 21, a reset unit 22, a pull-down unit 23 and a signal output OUTPUT, wherein, said pull-up unit 21 is connected to said signal output OUTPUT and is configured to pull up an output signal, so that the output signal is at high level;

said reset unit 22 is connected to a control end of said pull-up unit 21 and said signal output OUTPUT respectively and is configured to reset the potential of the control end of said pull-up unit 21 after said output signal is at high level, so that said output signal is at low level; and said pull-down unit 23 is connected to a control end of said pull-up unit 21 and said signal output OUTPUT respectively and is configured to pull down the potential of the control end of said pull-up unit 21 and said output signal after said reset unit 22 has reset the potential of the control end of said pull-up unit 21, so that said pull-up unit 21 switches off to control said output signal to maintain at low level.

Figure 3:
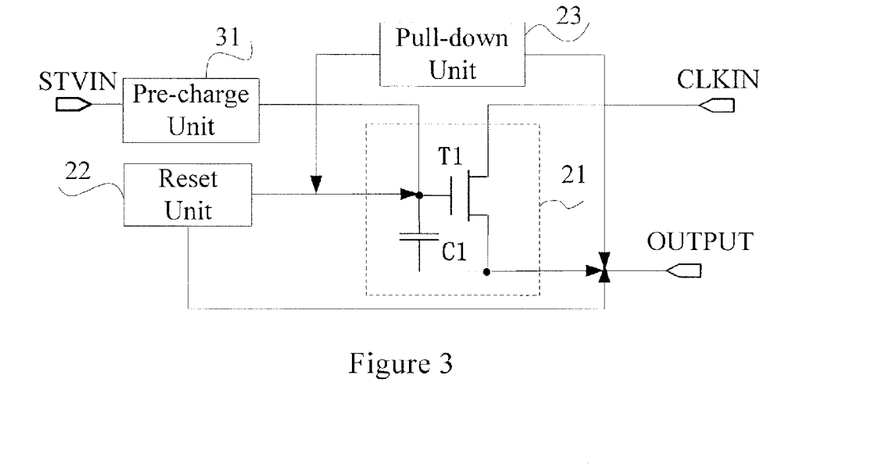
FIG. 3 is circuit diagram of a shift register according to the second embodiment of the present invention.

FIG. 3 shows a circuit diagram of a shift register according to the second embodiment of the present invention.

The shift register according to the second embodiment of the present invention is based on that according to the first embodiment of the present invention. The shift register according to the second embodiment of the present invention further comprises a pre-charge unit 31, said pull-up unit 21 comprises a first TFT T1 and a pull-up capacitor C1, and said pull-up capacitor C1 is in parallel connection between the gate and source of the first TFT T1;

said first TFT T1 is configured so that the drain is connected to a first clock signal input CLKIN, the source is connected to a signal output OUTPUT, and the gate is connected to a start signal input STVIN via said pre-charge unit 31; and said pre-charge unit 31 pre-charges said pull-up capacitor C1 under the control of the first clock signal CLK and the start signal STV before said pull-up unit 21 pulls up the output signal, so that said first TFT T1 turns on.

Figure 4:
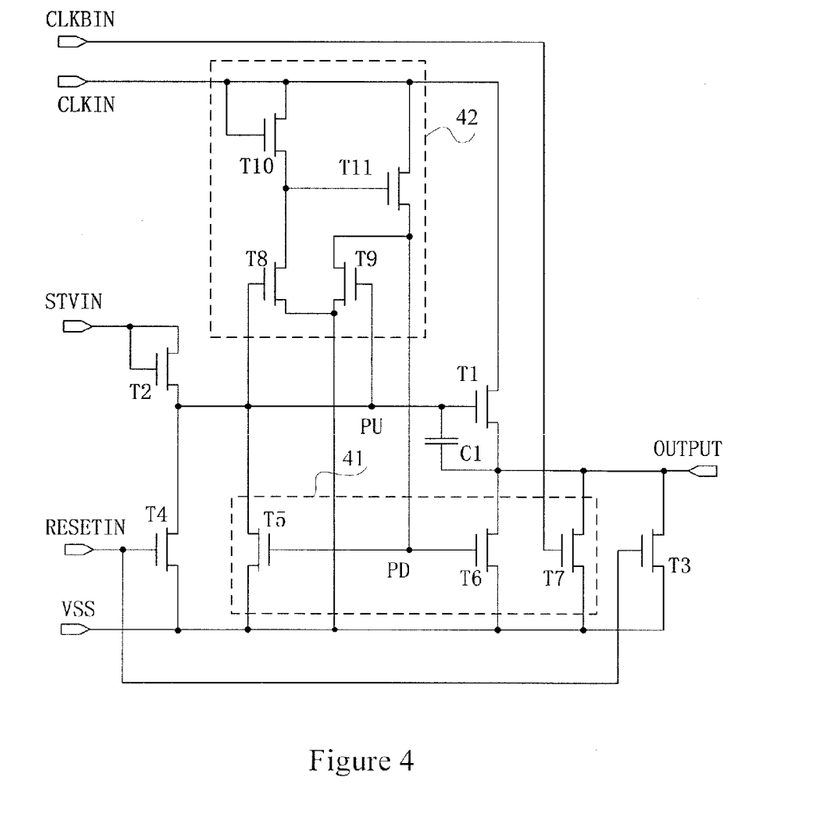
FIG. 4 is circuit diagram of a shift register according to the third embodiment of the present invention.

As shown in FIG. 4, a shift register according to the third embodiment of the present invention comprises a pre-charge unit, a pull-up unit, a reset unit, a pull-down unit, a first clock signal input CLKIN, a second clock signal input CLKBIN, a start signal input STVIN, a reset signal input RESETIN, a signal output OUTPUT, and the shift register according to the third embodiment of the present invention operates with dual-clock of CLK and CLKB being differential input, wherein, the output signal of said shift register is a gate driving signal OUT of a liquid crystal display;

the first clock signal CLK is input from the first clock signal input CLKIN;

the second clock signal CLKB is input from the second clock signal input CLKBIN;

the start signal STV is input from the start signal input STVIN;

the reset signal RESET is input from the reset signal input RESETIN;

said pull-up unit comprises a first TFT T1 and a pull-up capacitor C1;

the pull-up capacitor C1 is in parallel connection between the gate and the source of the first TFT T1;

said first TFT T1 is configured so that the drain is connected to the first clock signal input CLKIN, the source is connected to signal output OUTPUT, and the gate is connected to the start signal input STVIN via said pre-charge unit;

said pre-charge unit comprises a second TFT T2, and is configured to pre-charge said pull-up capacitor C1 during a half clock cycle when the first clock signal is at low level, the second clock signal is at high level and the start signal is at high level, so that the gate-source voltage of said first TFT T1 rises to a predetermined voltage that is greater than the threshold voltage of said first TFT T1, so that said first TFT T1 turns on;

said first TFT T1 is configured to pull up the potential of the pull-up output signal and node PU (i.e. the node that is connected to the gate of said pull-up TFT T1) during a half clock cycle when the first clock signal is at low level and the start signal is at high, so that the output signal is a high level;

said second TFT T2 is configured so that the gate and drain are connected to the start signal input STVIN, and the source is connected to the gate of said first TFT T1;

said reset unit comprises a third TFT T3 and a fourth TFT T4 and is configured to reset said output signal during a half clock cycle when the reset signal is at high level after the output signal is at high level, so that the output signal is at low level;

said third TFT T3 is configured so that the gate is connected to the reset signal input RESETIN, the drain is connected to the signal output OUTPUT and the source is connected to power supply VSS;

said fourth TFT T4 is configured so that the gate is connected to the reset signal input RESETIN and the gate of said third TFT T3 respectively, the drain is connected to the gate of said first TFT T1, and the source is connected to the source of the third TFT T3 and the power supply VSS respectively;

said pull-down unit is configured to pull down the output signal after the half clock cycle, so that the output signal is at low level; and said pull-down unit comprises a dual-pull-down module 41 a dual-pull-down control module 42, wherein, said dual-pull-down module 41 is connected to said dual-pull-down control module 42, said signal output OUTPUT and the control end of said pull-up unit (i.e. node PU in FIG. 4) respectively, and is configured to alternately pull down the potential of said output signal and the control end of said pull-up unit under the control of said dual-pull-down control module 42;

said dual-pull-down module 41 comprises a fifth TFT T5, a sixth TFT T6 and a seventh TFT T7;

said dual-pull-down control module 42 comprises an eighth TFT T8, a ninth TFT T9, a tenth TFT T10 and an eleventh TFT T11;

said fifth TFT T5 is configured so that the gate is connected to the gate of said sixth TFT T6, the drain of said ninth TFT T9 and the source of said eleventh TFT T11 respectively, the source is connected to the power supply VSS and the drain is connected to the gate of said first TFT T1, the source of said second TFT T2 and the gate of said eighth TFT T8 respectively;

said sixth TFT T6 is configured so that the source is connected to the power supply VSS and the drain is connected to the signal output OUTPUT;

said seventh TFT T7 is configured so that the gate is connected to the second clock signal input CLKBIN, the source is connected to the power supply VSS and the drain is connected to the signal output OUTPUT;

said eighth TFT T8 is configured so that the gate is connected to the gate of said first TFT T1, the source is connected to the power supply VSS and the drain is connected to the source of the tenth TFT T10 and the gate of the eleventh TFT T11 respectively;

said ninth TFT T9 is configured so that the gate is connected to the gate of said first TFT T1, the source is connected to the power supply VSS and the drain is connected to the source of said eleventh TFT T11;

said tenth TFT T10 is configured so that the gate and drain are connected to the first clock signal input CLKIN, and the source is connected to the gate of the eleventh TFT T11;

said eleventh TFT T11 is configured so that the drain is connected to the first clock signal input CLKIN; and T6 and T7 alternately pull down the output signal so the output of said shift register is prevented from floating;

T8, T9, T10 and T11 constitute an inverter, which may enable a fast switch of the voltage of node PD (the node connected to the gate of T6) and node PU (the node connected to the gate of T1). Meanwhile, the inverter constituted of T8, T9, T10 and T11 is configured so that the pull-up voltage consumption is smaller than that of a single stage inverter, and in the case of low temperature, the mobility of the carriers is lower, and in order to reach the same driving effect, a higher driving voltage is required, which leads to a good effect of the inverter constituted of T8, T9, T10 and T11 in the low temperature condition. Simulation results demonstrate that the inverter constituted of T8, T9, T10 and T11 has a good effect in the low temperature condition.

In the shift register according to the embodiment:

a second TFT T2 is configured to pre-charge said pull-up capacitor C1 during the half clock cycle when the start signal STV is at high level;

a first TFT T1 is configured to output a high level signal for gate driving during the half clock cycle when CLK is at high level after said pull-up capacitor C1 is pre-charged;

a fourth TFT T4 is configured to reset the potential of node PU after the current state shift register outputs a gate driving square wave;

a third TFT T3 is configured to pull down and reset the output signal of the current stage shift register under the control of the output of the next stage shift register, after the first TFT T1 outputs the high level signal for gate driving during the half clock cycle when the CLK turns to a low level and the CLKB turns to a high level;

said dual-pull-down control module 42 is configured to control the operation of said dual-pull-down module 41 under the control of dual-clock CLK and CLKB and the potential of node PU; and said dual-pull-down module 41 is configured to alternately pull down the output signal of the current stage shift register and the potential of node PU, under the control of the output signal of the dual-pull-down control module 42.

In an embodiment of the present invention, the power supply VSS is at low level output.

Figure 5:
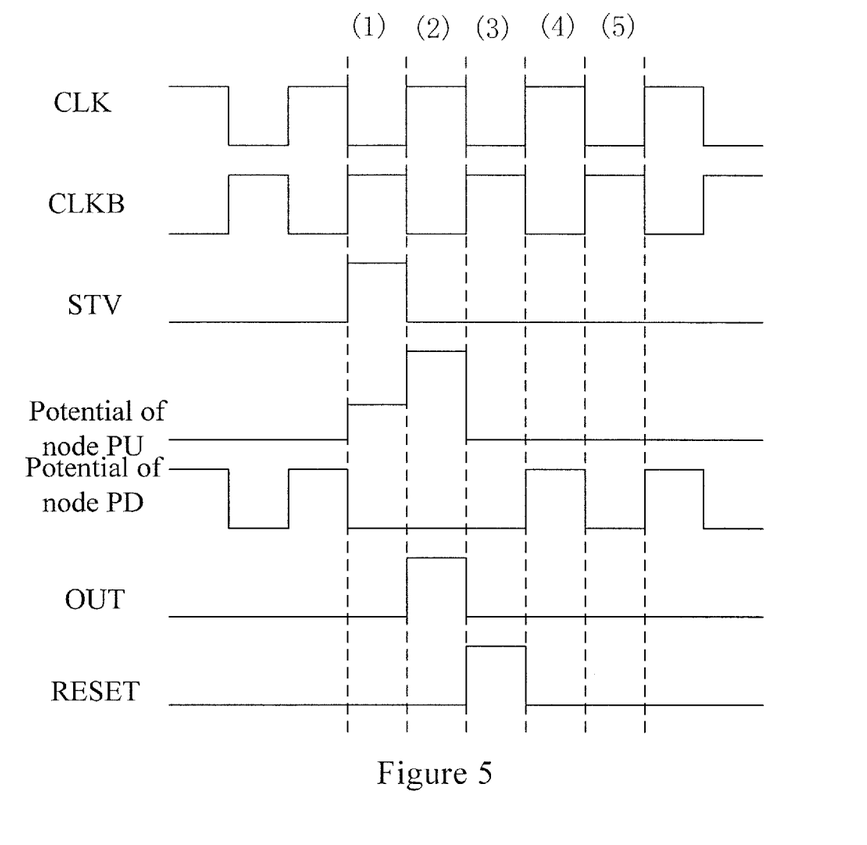
FIG. 5 is a timing chart of a first clock signal CLK, a second clock signal CLKB, a start signal STV, a PU node potential, a PD node potential, a gate driving signal OUT and a reset signal RESET of the shift register according to the embodiment.

Next, reference will be made to a circuit diagram of the shift register according to the third embodiment as shown in FIG. 4 and a timing chart of all the signals of the shift register as shown in FIG. 5 to analyze the operational principle of the shift register of the embodiment.

(1) pre-charge stage: CLK is at low level, CLKB is at high level, STV is at high level, and RESET is at low level; T3, T4, T10 and T11 turn off, and T2 and T7 turn on; the gate driving signal OUT is set to a low level; STV pre-charges the pull-up capacitor C1 so that the voltage at PU node rises without turning on T8 and T9; the potential of PD node is at low level, T5 and T6 both turn off so that the gate of T1 (i.e. PU node) maintains a pre-charging state, and gate driving signal OUT maintains a low level;

(2) pull-up stage: after the pre-charge stage, CLK is at high level, CLKB is at low level, STV is at low level, and RESET is at low level; T3, T2, T4 and T7 turn off, the potential of node PU rises, T1 turns on, and the gate driving signal OUT is pulled up to a high level signal; T10, T11, T8 and T9 turn on, the width-length ratio of T10, T11, T8 and T9 is designed so that the potential of node PD is at low level, and T5 and T6 turn off; the potential of node PU maintains a high level and the start signal STV is shifted;

(3) reset stage: STV is at low level, CLK is at low level, CLKB is a high level, and RESET is at high level; T1, T2, T10, T11, T8 and T9 turn off, T3, T4 and T7 turn on, the potential of the node PD is at low level, the node PU is set to at low level, and the gate driving signal OUT is set to at low level;

(4) first pull-down stage: CLK is at high level, CLKB is at low level, STV is at low level, and RESET is at low level; T1, T3, T2, T4, T7, T8 and T9 turn off, T10 and T11 turn on, the potential of node PD is at high level, T5 and T6 turn on, and the potential of node PU and gate driving signal OUT are pulled down to a low level;

(5) second pull-down stage: CLK is at low level, CLKB is at high level, STV is at low level, and RESET is at low level; T1, T2, T3 and T4 turn off, the potential of node PU and node PD is at low level, T8, T9, T5 and T6 turn off, T7 turns on, gate driving signal OUT is pulled down to a low level.

Such that the shift from start signal STV to gate driving signal OUT is achieved, in other words, the gate driving scanning output from top to bottom is achieved under the control of dual-clock, the operation cycle of the pull-down TFT is reduced and thus the Vth shift problem is improved.

Additionally, the present invention reduces the floating of the output signal in the shift register and node PU, as well as stray effect.

Figure 6:
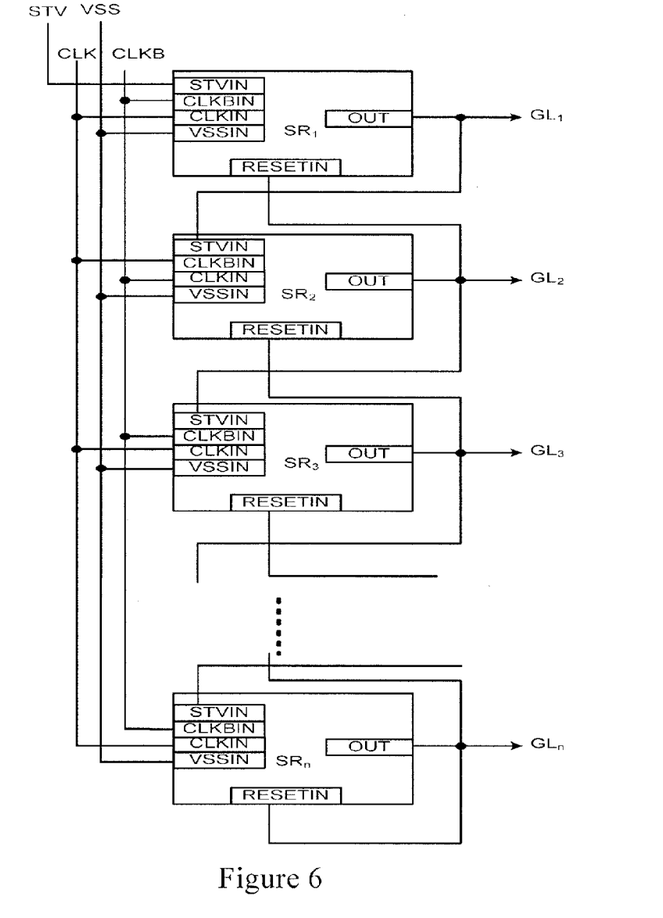
FIG. 6 is a circuit diagram of the liquid crystal display gate driving apparatus according to the present invention.
Figure 7:
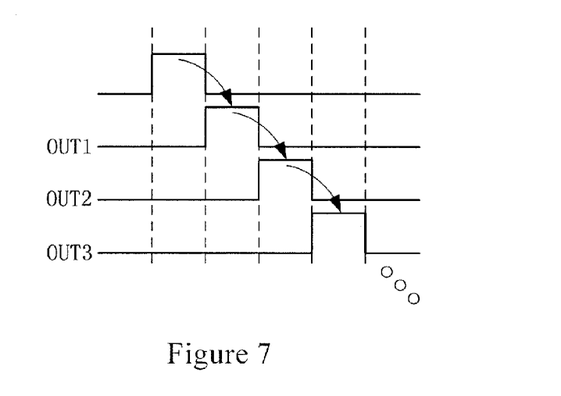
FIG. 7 is a timing chart of an output signal of the liquid crystal display gate driving apparatus according to the present invention.

An embodiment of the liquid crystal gate driving apparatus according to the present invention is shown in FIG. 6, where STV is the start signal, the output signal of a previous stage is taken as a start signal STV, and the output signal of the next stage is taken as a reset signal RESET by each stage of shift register, and it operates with dual-clock and implements gate driving scanning output from top to bottom. FIG. 7 is a shift output waveform diagram of the liquid crystal display gate driving apparatus according to the embodiment.

In FIG. 6, SR1 is a first stage shift register, SR2 is a second stage shift register, SR3 is a third stage shift register, and SRn is an $n^{th}$ shift register, where n is a positive integer greater than 3; GL1 is a first gate, GL2 is a second gate, GL3 is a third gate, and GL n is an $n^{th}$ th gate.

In FIG. 7, OUT1 is the output signal of the first stage shift register, OUT2 is the output signal of the second stage shift register, and OUT3 is the output signal of the third stage shift register.

Figure 8:
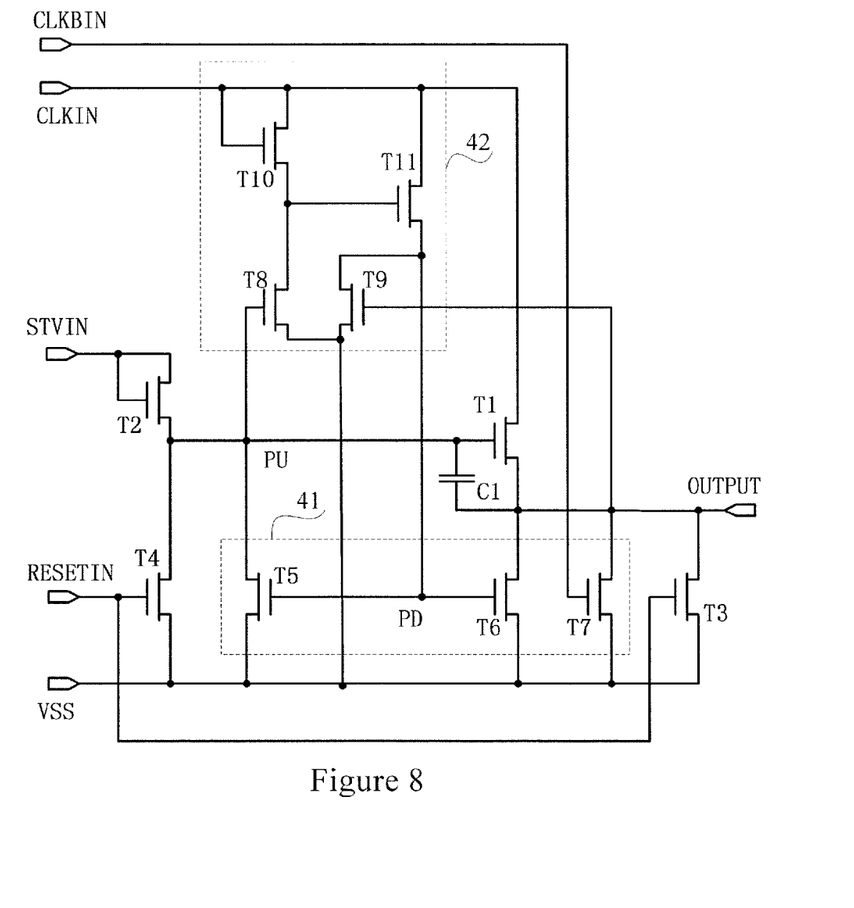
FIG. 8 is circuit diagram of a shift register according to the fourth embodiment of the present invention.

FIG. 8 shows a circuit diagram of the shift register according to the fourth embodiment of the present invention. The shift register according to the fourth embodiment of the present invention differs from that according to the third embodiment of the present invention in that, the gate of T9 is connected to the signal output OUTPUT rather than to the gate of TFT T1.

Figure 9:
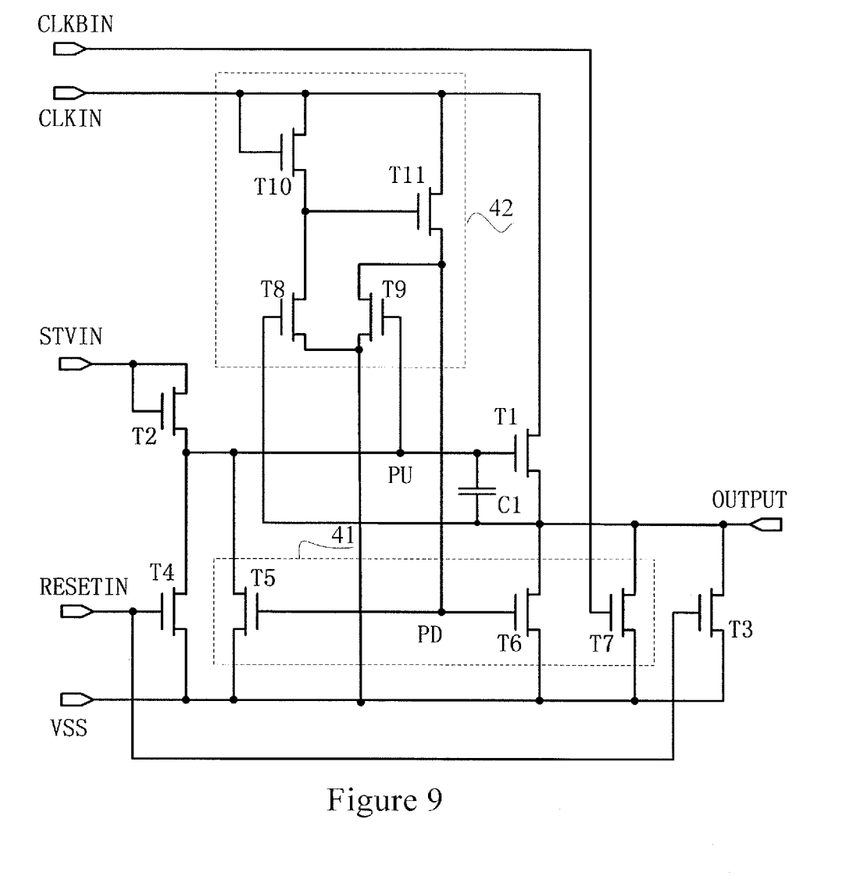
FIG. 9 is circuit diagram of a shift register according to the fifth embodiment of the present invention.

FIG. 9 shows a circuit diagram of the shift register according to the fifth embodiment of the present invention. The shift register according to the fifth embodiment of the present invention differs from that according to the third embodiment of the present invention in that, the gate of T8 is connected to the signal output OUTPUT rather than to the gate of the pull-up TFT T1.

Figure 10:
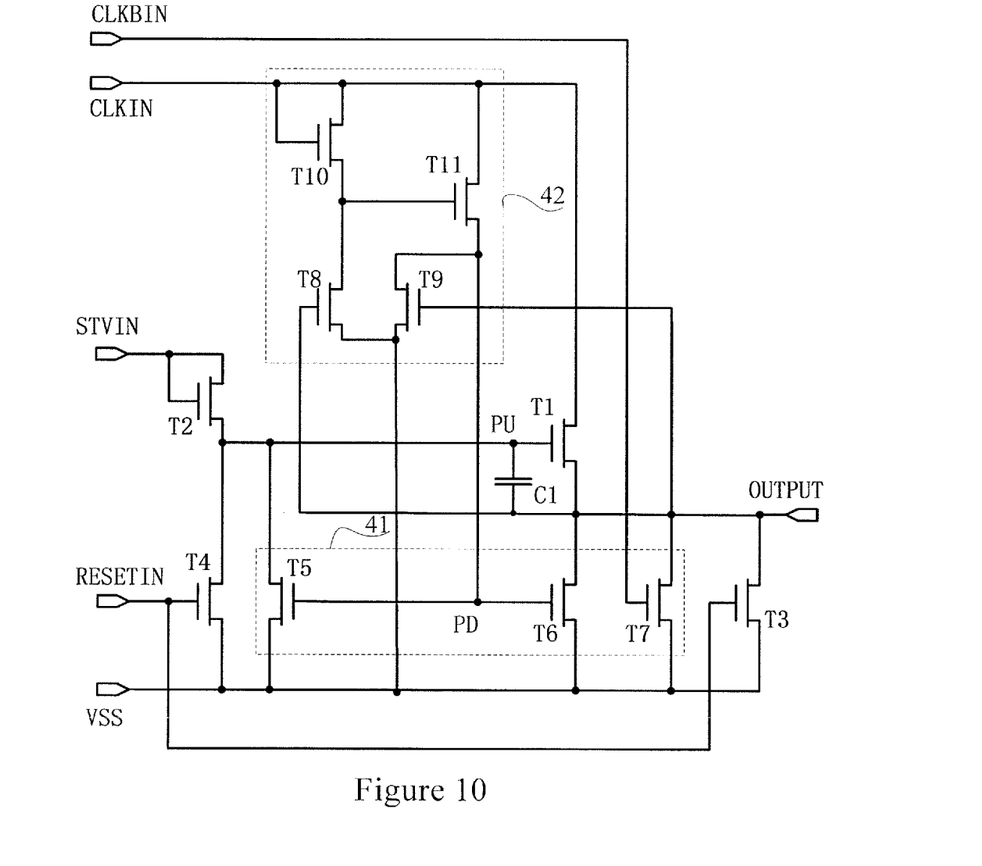
FIG. 10 is circuit diagram of a shift register according to the sixth embodiment of the present invention.

FIG. 10 shows a circuit diagram of the shift register according to the sixth embodiment of the present invention. The shift register according to the sixth embodiment of the present invention differs from that according to the third embodiment of the present invention in that, the gate of T8 is connected to the signal output OUTPUT rather than to the gate of the pull-up TFT T1, and the gate of T9 is connected to the signal output OUTPUT rather than to the gate of the TFT T1.

The present invention only uses a power supply VSS and has avoided using a large capacitor or having a capacitor connected to a clock signal directly, which is advantageous to reduce the power consumption and scale of the circuit.

The present invention addresses the issue of stray effect brought by a clock modulation improves the problem of shifting of a pull-down TFT threshold voltage under a DC bias by a dual-pull-down design, and thus improves the reliability of the circuit; in the meantime the usage of the power supply and the power consumption are reduced.

The above description is only descriptive and it is not restrictive for the present invention. An ordinary skilled in the art will be able to make a variety of modification, variations and equivalents without departing from the spirit and scope defined in the appended claims, and such modifications, variations and equivalents should be considered as falling into the protection scope of the present invention.

What is claimed is:

1. A shift register, comprising a pull-up unit, a reset unit and a signal output, wherein, said pull-up unit is connected to said signal output and is configured to pull up an output signal, so that the output signal is at high level;

said reset unit is connected to a control end of said pull-up unit and said signal output respectively, and is configured to reset the potential of the control end of said pull-up unit after said output signal is at high level, so that said output signal is at low level; and wherein said shift register further comprises a pull-down unit;

said pull-down unit is connected to a control end of said pull-up unit and said signal output respectively and is configured to pull down the potential of the control end of said pull-up unit and said output signal after said reset unit has reset the potential of the control end of said pull-up unit, so that said pull-up unit switches off to control said output signal to maintain a low level, said pull-down unit comprises a dual-pull-down control module, and said dual-pull-down control module is connected to a first clock signal input;

said dual-pull-down control module comprises an eighth thin film transistor (TFT), a ninth TFT, a tenth TFT and an eleventh TFT;

said eighth TFT is configured so that the gate is connected to the gate of a first TFT, the source is connected to a low level output, and the drain is connected to the source of the tenth TFT and the gate of the eleventh TFT respectively;

said ninth TFT is configured so that the gate is connected to said signal output, the source is connected to the low level output, and the drain is connected to the source of said eleventh TFT;

said tenth TFT is configured so that the gate and the drain are connected to the first clock signal input, and the source is connected to the gate of the eleventh TFT; and said eleventh TFT is configured so that the drain is connected to the first clock signal input.

2. The shift register according to claim 1, further comprising a pre-charge unit, said pull-up unit comprises said first TFT and a pull-up capacitor, said pull-up capacitor is in parallel connection between the gate and source of said first TFT;

said first TFT is configured so that the drain is connected to the first clock signal input, the source is connected to the signal output, and the gate is connected to a start signal input via said pre-charge unit; and said pre-charge unit pre-charges said pull-up capacitor under the control of the first clock signal and the start signal before said pull-up unit pulls up the output signal, so that said first TFT turns on.

3. The shift register according to claim 2, wherein, said pre-charge unit comprises a second TFT;

said second TFT is configured so that the gate and drain are connected to the start signal input, and the source is connected to the gate of said first TFT;

said reset unit comprises a third TFT and a fourth TFT;

said third TFT is configured so that the gate is connected to a reset signal input, the drain is connected to the signal output and the source is connected to the low level output; and said fourth TFT is configured so that the gate is connected to the reset signal input and the gate of said third TFT respectively, the drain is connected to the gate of said first TFT, and the source is connected to the source of the third TFT and a low level output respectively.

4. The shift register according to claim 3, said pull-down unit further comprises a dual-pull-down, wherein, said dual-pull-down module is connected to said dual-pull-down control module, said signal output and the control end of said pull-up unit respectively, and is configured to alternately pull down the potential of said output signal and the control end of said pull-up unit under the control of said dual-pull-down control module.

5. The shift register according to claim 4, wherein,
said dual-pull-down module comprises a fifth TFT, a sixth TFT and a seventh TFT;
said dual-pull-down module is connected to a second clock signal input;
said fifth TFT is configured so that the gate is connected to the gate of said sixth TFT, the drain of said ninth TFT and the source of said eleventh TFT respectively, the source is connected to the low level output, and the drain is connected to the gate of said first TFT, the source of said second TFT and the gate of said eighth TFT respectively;
said sixth TFT is configured so that the source is connected to the low level output and the drain is connected to the signal output; and
said seventh TFT is configured so that the gate is connected to the second clock signal input, the source is connected to the low level output, and the drain is connected to said signal output.

6. A method for driving a shift register, applied to the shift register according to claim 1, wherein the method for driving a shift register comprises the following steps:
the pull-up unit pulling up an output signal of each stage of the shift register, so that the output signal of said stage of the shift register is at high level;
resetting the potential of the control end of said pull-up unit after said output signal is a high level, so that said output signal is at low level; and
the pull-down unit pulling down the potential of the control end of said pull-up unit and said output signal, so that said pull-up unit switches off and said output signal maintains a low level.

7. The method for driving a shift register according to claim 6, wherein, when said pull-up unit comprises said first TFT and a pull-up capacitor, and the pull-up capacitor being in parallel connection between the gate and source of said first TFT, said method for driving a shift register further comprises a pre-charging step prior to said pulling-up step: pre-charging said pull-up capacitor when the first clock signal is a low level and a start signal is a high level, so that said first TFT turns on.

8. A gate driving apparatus, comprising multiple stages of the shift register according to any claim of claim 1;
except for the first stage of shift register, the signal output of every shift register is connected to the reset signal input of the adjacent previous shift register; and
except for the last stage of shift register, the signal output of every shift register is connected to the start signal input of the adjacent next shift register thereby.

* * * * *